United States Patent
Suzuki et al.

(10) Patent No.: US 6,829,270 B2
(45) Date of Patent: Dec. 7, 2004

(54) NITRIDE III-V COMPOUND SEMICONDUCTOR SUBSTRATE, ITS MANUFACTURING METHOD, MANUFACTURING METHOD OF A SEMICONDUCTOR LIGHT EMITTING DEVICE, AND MANUFACTURING METHOD OF A SEMICONDUCTOR DEVICE

(75) Inventors: Yasuhiko Suzuki, Miyagi (JP); Takeharu Asano, Miyagi (JP); Motonobu Takeya, Miyagi (JP); Osamu Goto, Miyagi (JP); Shinro Ikeda, Miyagi (JP); Katsuyoshi Shibuya, Miyagi (JP)

(73) Assignee: Sony Corporation (JP)

( * ) Notice: Subject to any disclaimer, the term of this patent is extended or adjusted under 35 U.S.C. 154(b) by 20 days.

(21) Appl. No.: 10/228,181

(22) Filed: Aug. 27, 2002

(65) Prior Publication Data

US 2003/0045103 A1 Mar. 6, 2003

(30) Foreign Application Priority Data

Aug. 28, 2001  (JP) .................................... P2001-257606

(51) Int. Cl.$^7$ ................................................ H01S 5/00
(52) U.S. Cl. .................................................. 372/43
(58) Field of Search ...................... 372/43–50; 257/79; 438/22; 117/2

(56) References Cited

U.S. PATENT DOCUMENTS 5,970,080 A * 10/1999 Hata ............................ 372/45
6,469,320 B2 * 10/2002 Tanabe et al. ................ 257/79
6,488,767 B1 * 12/2002 Xu et al. ....................... 117/2

* cited by examiner

*Primary Examiner*—Quyen Leung
(74) *Attorney, Agent, or Firm*—Rader, Fishman & Grauer PLLC; Ronald P. Kananen

(57) ABSTRACT

When GaN or other nitride III-V compound semiconductor layers are grown on a substrate such as a sapphire substrate, thickness x of the substrate relative to thickness y of the nitride III-V compound semiconductor layers is controlled to satisfy $0 < y/x \leq 0.011$ and $x \geq 450$ μm. Alternatively, if the maximum dimension of the substrate is D (cm), its warpage H is in the range of $0 < H \leq 70 \times 10^{-4}$ (cm), and $Z = y/x$, D is controlled to satisfy the relation $0 < D < (2/CZ)\cos^{-1}(1-HCZ)$, where C (cm$^{-1}$) is the proportionality constant when the radius of curvature of the substrate ρ (cm) is expressed as $1/\rho = CZ$.

9 Claims, 10 Drawing Sheets

Fig. 3

| THICKNESS OF SUBSTRATE (x) [μm] | THICKNESS OF GaN LAYERS (y) [μm] | y/x | RADIUS OF CURVATURE [cm] | DIAMETER OF SUBSTRATE [cm] | θ [rad] | WARPAGE (H) 430 μm | WARPAGE (H) 700 μm |
|---|---|---|---|---|---|---|---|
| 430 | 1 | 0.002325581 | 1864 | 5 | 0.0013412 | 16.76501895 | |
| 430 | 1 | 0.002325581 | 1861 | 5 | 0.00134336 | 16.79204476 | |
| 430 | 2 | 0.004651163 | 1016 | 5 | 0.00246063 | 30.7578585 | |
| 430 | 2 | 0.004651163 | 1011 | 5 | 0.0024728 | 30.90997436 | |
| 430 | 3 | 0.006976744 | 669 | 5 | 0.00373692 | 46.71145536 | |
| 430 | 3 | 0.006976744 | 654 | 5 | 0.00382263 | 47.78281643 | |
| 430 | 4 | 0.009302326 | 530 | 5 | 0.00471698 | 58.96215483 | |
| 430 | 5 | 0.011627907 | 440 | 5 | 0.00568182 | 71.0225362 | |
| 430 | 7 | 0.01627907 | 440 | 5 | 0.00568182 | 71.0225362 | |
| 700 | 2 | 0.002857143 | 2788 | 5 | 0.0008967 | | 11.20875104 |
| 700 | 2 | 0.002857143 | 2546 | 5 | 0.00098193 | | 12.27415455 |
| 700 | 2 | 0.002857143 | 2529 | 5 | 0.00098853 | | 12.35666171 |
| 700 | 2 | 0.002857143 | 2374 | 5 | 0.00105307 | | 13.16343602 |
| 700 | 2 | 0.002857143 | 2083 | 5 | 0.00120019 | | 15.00239858 |
| 700 | 5 | 0.007142857 | 1080 | 5 | 0.00231481 | | 28.93517226 |
| 700 | 7 | 0.01 | 1080 | 5 | 0.00231481 | | 28.93517226 |

NITRIDE III-V COMPOUND SEMICONDUCTOR SUBSTRATE, ITS MANUFACTURING METHOD, MANUFACTURING METHOD OF A SEMICONDUCTOR LIGHT EMITTING DEVICE, AND MANUFACTURING METHOD OF A SEMICONDUCTOR DEVICE

BACKGROUND OF THE INVENTION

1. Field of the Invention

This invention relates to a nitride III-V compound semiconductor substrate, its manufacturing method, a method of manufacturing a semiconductor light emitting device and a method of manufacturing a semiconductor device, which are especially suitable for use in manufacturing semiconductor lasers and light emitting diodes, or electron transporting devices.

2. Description of the Related Art

In recent years, semiconductor lasers using nitride III-V compound semiconductors such as AlGaInN (hereinbelow called GaN compound semiconductor lasers) have been under active research and development in the hope of making semiconductor lasers capable of emitting light over the range from the blue region to the ultraviolet region necessary for enhancing the density of optical discs. Lately, efforts are being expended to farther improve their lifetimes and properties toward their practical use.

When manufacturing such a GaN compound semiconductor laser, a laser structure is most typically formed by crystal growth of a GaN compound semiconductor layer on a sapphire substrate. For example, using a sapphire substrate sized 50 mm (2 inches) in diameter and 430 $\mu$m in thickness, a GaN compound semiconductor layer is grown thereon up to a thickness around 7 $\mu$m in total.

However, if a GaN compound semiconductor has a thickness around 7 $\mu$m on a sapphire substrate as mentioned above, the sapphire substrate warps due to a difference in thermal expansion coefficient between the sapphire and the nitride III-V compound semiconductor such as GaN. This warpage measures as large as 80 $\mu$m.

This large warpage of the sapphire substrate adversely works against exposure in a manufacturing process of a GaN compound semiconductor laser and polishing of the bottom surface of the sapphire substrate.

More specifically, in the exposure process, the sapphire substrate, having GaN compound semiconductor layers grown thereon and a resist coated on its surface, undergoes exposure through a photo mask. If the sapphire substrate largely warps as mentioned above, distance between the photo mask and the resist may become uneven within the area of the substrate, or a dimensional deviation may be produced between the photo mask and the substrate within the area of the substrate. Thus the mask cannot accurately fit the entire surface of the substrate. As a result, especially when a base GaN layer is laterally grown on the sapphire substrate by ELO (epitaxial lateral overgrowth) and GaN compound semiconductor layers forming a laser structure are grown thereon by crystal growth, it is difficult to form a ridge in a less-defective region (wing portion) between a seed crystal and a coalescing portion of the lateral growth, and the ridge often deviates from the wing portion. Therefore, this problem adversely affects the laser properties, and in particular, its lifetime, and also degrades the production yield.

For making cavity edges, it is the most usual way to cleave a sapphire substrate having GaN compound semiconductor layers grown thereon. For easier cleavage, it is necessary to thin the sapphire substrate by partly removing it from the bottom by polishing. However, if the sapphire substrate largely warps as mentioned above, it often cracks during polishing.

Furthermore, if the warpage of the sapphire substrate is large during crystal growth of the GaN compound semiconductor layers, because of uneven temperature distribution along the plane, the resulting GaN compound semiconductor layers become uneven in composition and thickness.

Under the circumstances, there is a demand for a technique capable of sufficiently reducing warpage of substrates, namely, not to exceed 70 $\mu$m, to remove the above-mentioned problems caused by warpage of sapphire substrates.

OBJECTS AND SUMMARY OF THE INVENTION

It is therefore an object of the invention to provide a nitride III-V compound semiconductor substrate and its manufacturing method capable of limiting warpage of substrates not to exceed 70 $\mu$m.

A further object of the invention is to provide a method of manufacturing a semiconductor light emitting device that can be used when manufacturing the semiconductor light emitting device by using a nitride III-V compound semiconductor substrate made by forming a nitride III-V compound semiconductor layer on a substrate of a material different from the nitride III-V compound semiconductor layer, and can limit warpage of the substrate not to exceed 70 $\mu$m, thereby to successfully carry out exposure in the lithographic process and polishing of the bottom surface of the substrate.

A still further object of the invention is to provide a method of manufacturing a semiconductor device that can be used when manufacturing the semiconductor device by using a nitride III-V compound semiconductor substrate made by forming a nitride III-V compound semiconductor layer on a substrate of a material different from the nitride III-V compound semiconductor layer, and can limit warpage of the substrate not to exceed 70 $\mu$m, thereby to successfully carry out exposure in the lithographic process and polishing of the bottom surface of the substrate.

The Inventor conducted vigorous research to solve the above-indicated problems. An outline of the research is shown below.

GaN layers were grown on sapphire substrates sized 430 $\mu$m and 700 $\mu$m in thickness, and 50 mm in diameter. FIG. 1 shows measured values of thickness of GaN layers and measured values of warpage (H) of the sapphire substrates. For growth of the GaN layers, metal organic chemical vapor deposition (MOCVD) was used. It is appreciated from FIG. 1 that the warpage of the sapphire substrate increases proportionally to the thickness of the GaN layer.

In case a laser structure of GaN compound semiconductor layers is formed on the sapphire substrate, for the purpose of forming a less-defective layer by using a lateral growth technique such as ELO or preventing the operation voltage from increasing when both the n-side electrode and the p-side electrode are formed on a common plane, thickness of the n-type GaN layer grown as the base layer of the laser structure on the sapphire substrate is preferably not smaller than 3 to 5 $\mu$m. However, if the GaN layer is grown by 5 $\mu$m on the sapphire substrate sized 430 $\mu$m in thickness and 50 mm in diameter, the warpage exceeds 70 μm as shown in FIG. 1. In contrast, if the GaN layer is grown by 5 μm on the sapphire substrate sized 700 μm in thickness and 50 mm in diameter, the warpage largely decreases to around 30 μm. As such, when GaN compound semiconductor layers forming a laser structure (cladding layer, waveguide layer, active layer, and so on, which are approximately 2 μm thick in total) are formed on a 5 μm thick base GaN layer, the increase of warpage of the substrate is small. That is, warpage largely depends on the thickness of the base GaN layer.

FIG. 2 shows measured values of warpage of diametrically 50 mm long and x(μm) thick sapphire substrates having y(μm) thick GaN layers thereon, putting Z=y/x on the abscissa and warpage H(μm) on the ordinate. It is appreciated from FIG. 2 that the warpage reaches and surpasses 80 μm under Z in excess of 0.013, and it adversely affects the mask-fitting in the photolithographic process and polishing of the substrate bottom surface. If y/x is adjusted not to exceed 0.011, the warpage can be limited not to exceed 70 μm. To ensure that the warpage does not exceed 40 μm to enhance the production yield, Z must be 0.006 or less.

Basic data of FIGS. 2 and 3 is collectively shown in FIG. 3.

Also from the viewpoint of improving evenness of the temperature distribution along the substrate plane during crystal growth, warpage of the substrate must be minimized. Evenness of the temperature distribution is required for ensuring evenness of the Al composition distribution of the cladding layer of the GaN compound semiconductor laser, distribution of the thickness of each layer and distribution of composition of the active layer (corresponding to the distribution of the emission wavelength). Especially, the active layer needs accurate temperature control and temperature distribution control because the emission wavelength changes by approximately 1 nm with change of the growth temperature by 1° C. If warpage occurs in the substrate, the temperature distribution on the substrate surface increases, and the composition distribution of the active layer (distribution of the emission wavelength) also increases. This results in increasing the region where the emission wavelength deviates from the desired wavelength and decreasing the production yield. If Z is decreased to 0.011 or less and the warpage is limited not to exceed 70 μm, then the production yield can be enhanced also from the above-mentioned viewpoint.

On the other hand, warpage of the substrate depends on the substrate size as well. Even when Z is large, if the substrate is small, warpage can be reduced. Taking this into consideration, the relation between Z and the substrate diameter D for limiting the warpage H below a certain value was found as Equation (1) below and as shown in FIG. 4.

$$0<D<(2/CZ)\cos^{-1}(1-HCZ) \quad (1)$$

where Z=y/x and C are constants determined by the thickness of the substrate.

Equation (1) is obtained as follows. Assume here that a substrate having the diameter D (cm) warps as shown in FIG. 5. If the warpage is H (cm), the radius of curvature of the substrate is ρ (cm$^{-1}$), and the view angle of the full span of the substrate from the curvature center is θ (rad), then they have the following relations.

$$\rho \cdot \theta = D \quad (2)$$

$$H = \rho(1-\cos(\theta/2)) \quad (3)$$

An experiment made by the Inventor demonstrates that the curvature 1/ρ is proportional to Z=(thickness of nitride III-V compound semiconductor layer)/(thickness of substrate)=y/x, in the following relationship.

$$1/\rho = CZ \quad (4)$$

where C (cm$^{-1}$) is a proportionality constant that is definitely determined by a fixed thickness of the substrate of a particular material.

As an example, in case the substrate is a 430 μm thick sapphire substrate and the overlying nitride III-V compound semiconductor layer is a GaN layer, Z and 1/ρ make the relation shown in FIG. 6. At the time the proportionality constant C is C=0.20567 (cm$^{-1}$).

From Equations (2), (3) and (4), the relation between D and Z is as follows.

$$D=(2/CZ)\cos^{-1}(1-HCZ) \quad (5)$$

By determining the substrate diameter to be smaller than D obtained by Equation (5) for the warpage H given, the warpage of the substrate can be limited not to exceed H. That is, when this substrate diameter is D and taking D>0 into account, by determining the diameter D of the substrate to satisfy $$0<D<(2/CZ)\cos^{-1}(1-HCZ) \quad (6)$$

the warpage of the substrate can be limited not to exceed H. The condition for limiting the warpage of the substrate not to exceed 70 μm is 0<H≤70×10$^{-4}$ (cm), and the condition for limiting the warpage of the substrate not to exceed 40 μm is 0<H≤40×10$^{-4}$ (cm).

Although the foregoing explanation was directed to circular substrates, the invention is not limited to circular substrates, but it is applicable to other shapes of substrates within the limit not inviting difficulties from the viewpoint of the process and the like. In this case, the maximum dimension along the substrate plane may be regarded as D.

Further, the foregoing explanation is also applicable to substrates other than sapphire substrates provided those other substrates have a difference in thermal expansion coefficient from that of the nitride III-V compound semiconductor, which is equivalent to or lower than the difference the sapphire substrates have.

The invention has been made through further research based on the above-explained research by the Inventor.

According to the first aspect of the invention, there is provided a nitride III-V compound semiconductor substrate in which nitride III-V compound semiconductor layers are formed on a substrate of a material different from those of the nitride III-V compound semiconductor layers, comprising:

$$0<y/x \leq 0.011 \text{ and } x \geq 450 \text{ μm}$$

being satisfied when thickness of the substrate is x (μm) and thickness of the nitride III-V compound semiconductor layers is y(μm).

According to the second aspect of the invention, there is provided a method of manufacturing a nitride III-V compound semiconductor substrate in which nitride III-V compound semiconductor layers are formed on a substrate of a material different from those of the nitride III-V compound semiconductor layers, comprising:

$$0<y/x \leq 0.011 \text{ and } x \geq 450 \text{ μm}$$

being satisfied when thickness of the substrate is x (μm) and thickness of the nitride III-V compound semiconductor layers is y (μm).

According to the third aspect of the invention, there is provided a method of manufacturing a semiconductor light emitting device using a nitride III-V compound semiconductor substrate in which nitride III-V compound semiconductor layers are formed on a substrate of a material different from those of the nitride III-V compound semiconductor layers, comprising:

just before the start of at least one process, the nitride III-V compound semiconductor substrate satisfying $$0<y/x \leq 0.011 \text{ and } x \geq 450 \ \mu m$$

when thickness of the substrate is x (μm) and thickness of the nitride III-V compound semiconductor layers is y (μm).

According to the fourth aspect of the invention, there is provided a method of manufacturing a semiconductor device using a nitride III-V compound semiconductor substrate in which nitride III-V compound semiconductor layers are formed on a substrate of a material different from those of the nitride III-V compound semiconductor layers, comprising:

just before the start of at least one process, the nitride III-V compound semiconductor substrate satisfying $$0<y/x \leq 0.011 \text{ and } x \geq 450 \ \mu m$$

when thickness of the substrate is x (μm) and thickness of the nitride III-V compound semiconductor layers is y (μm).

In the first to fourth aspects of the invention, the relation $0<y/x \leq 0.006$ is preferably satisfied to limit the warpage of the substrate not to exceed 40 μm.

According to the fifth aspect of the invention, there is provided a nitride III-V compound semiconductor substrate in which nitride III-V compound semiconductor layers are formed on a substrate of a material different from those of the nitride III-V compound semiconductor layers, comprising:

$$0<D<(2/CZ)\cos^{-1}(1-HCZ)$$

being satisfied when the maximum dimension of the substrate is D (cm), warpage of the substrate is in the range of $0<H \leq 70 \times 10^{-4}$ (cm), Z=(thickness of nitride III-V compound semiconductor layers)/(thickness of the substrate), and C (cm$^{-1}$) is the proportionality constant when the radius of curvature of the substrate ρ (cm) is expressed as 1/ρ=CZ.

According to the sixth aspect of the invention, there is provided a method of manufacturing a nitride III-V compound semiconductor substrate in which nitride III-V compound semiconductor layers are formed on a substrate of a material different from those of the nitride III-V compound semiconductor layers, comprising:

$$0<D<(2/CZ)\cos^{-1}(1-HCZ)$$

being satisfied when the maximum dimension of the substrate is D (cm), warpage of the substrate is in the range of $0<H \leq 70 \times 10^{-4}$ (cm), Z=(thickness of nitride III-V compound semiconductor layers)/(thickness of the substrate), and C (cm$^{-1}$) is the proportionality constant when the radius of curvature of the substrate ρ (cm) is expressed as 1/ρ=CZ.

According to the seventh aspect of the invention, there is provided a method of manufacturing a semiconductor light emitting device using a nitride III-V compound semiconductor substrate in which nitride III-V compound semiconductor layers are formed on a substrate of a material different from those of the nitride III-V compound semiconductor layers, comprising:

just before the start of at least one process, the relation $$0<D<(2/CZ)\cos^{-1}(1-HCZ)$$

being satisfied when the maximum dimension of the substrate is D (cm), warpage of the substrate is in the range of $0<H \leq 70 \times 10^{-4}$ (cm), Z=(thickness of nitride III-V compound semiconductor layers)/(thickness of the substrate), and C (cm$^{-1}$) is the proportionality constant when the radius of curvature of the substrate ρ (cm) is expressed as 1/ρ=CZ.

According to the eighth aspect of the invention, there is provided a method of manufacturing a semiconductor device using a nitride III-V compound semiconductor substrate in which nitride III-V compound semiconductor layers are formed on a substrate of a material different from those of the nitride III-V compound semiconductor layers, comprising:

just before the start of at least one process, the relation $$0<D<(2/CZ)\cos^{-1}(1-HCZ)$$

being satisfied when the maximum dimension of the substrate is D (cm), warpage of the substrate is in the range of $0<H \leq 70 \times 10^{-4}$ (cm), Z=(thickness of nitride III-V compound semiconductor layers)/(thickness of the substrate), and C (cm$^{-1}$) is the proportionality constant when the radius of curvature of the substrate ρ (cm) is expressed as 1/ρ=CZ.

In the fifth to eighth aspects of the invention, the warpage H preferably satisfies $0<H \leq 40 \times 10^{-4}$ (cm).

In the third, fourth, seventh and eighth aspects of the invention, the warpage of the substrate is preferably limited not to exceed 70 μm, more preferably no to exceed 40 μm, in a process largely affected by warpage of the substrate, such as a photolithographic process especially during its exposure, or just before starting a bottom polishing process.

In the present invention, the smaller the warpage of the substrate, the easier the process. However, excessive effort to reduce the warpage will result in excessively increasing the substrate thickness or excessively reducing the substrate diameter, and will degrade the productivity. On the other hand, although there is no essential upper limit of the substrate thickness, if the substrate is excessively thick, it takes large amounts of time for polishing of the substrate bottom and dicing, and it results in increasing the cost of the substrate itself. From the practical viewpoint, if the substrate is preferably thinner than 1 mm (1000 μm), it is effective to shorten the time required for polishing of the substrate bottom or dicing and to limit the cost of the substrate itself. In case the nitride III-V compound semiconductor to be formed on the substrate is desired to be thicker, thickness of the substrate must be increased unless the substrate size is reduced. Taking these factors into consideration, thickness of the substrate is preferably determined in the range of 600 μm≦x<1000 μm or more preferably in the range of 700 μm≦x<1000 μm. If the substrate is excessively small, each substrate yields fewer semiconductor light emitting devices or semiconductor devices, and the productivity degrades. Therefore, the substrate is preferably sized at least to have an area equivalent to that of a 1-inch substrate in diameter.

In the present invention, the nitride III-V compound semiconductor is composed of at least one kind of group III elements selected from the group consisting of Ga, Al, In and B, and one or more group V elements including at least N and may further include As and/or P. Examples of the nitride III-V compound semiconductor are GaN, AlGaN, AlN, GaInN, AlGaInN, InN, and the like.

The substrate for growing the nitride III-V compound semiconductor layer can be chosen from various kinds of substrates. For example, a sapphire substrate, SiC substrate, Si substrate, GaAs substrate, GaP substrate, InP substrate, spinel (MgAl$_2$O$_4$) substrate or silicon oxide substrate may be used.

For growth of the nitride III-V compound semiconductor, any appropriate technique such as metal organic chemical vapor deposition (MOCVD), hydride vapor phase epitaxial growth or halide vapor phase epitaxial growth HVPE), for example, may be used.

The semiconductor light emitting device can be a semiconductor laser or a light emitting diode, for example. Basically, the semiconductor device may be of any type that use the nitride III-V compound semiconductor. For example, it may be a light emitting device such as a semiconductor laser or light emitting diode, or an electron transporting device such as FET or heterojunction bipolar transistor.

BRIEF DESCRIPTION OF THE DRAWINGS

FIG. 3 is a schematic diagram that shows basic data of FIGS. 2 and 3;

DETAILED DESCRIPTION OF THE PREFERRED EMBODIMENTS

Some embodiments of the invention will be explained below with reference to the drawings.

For convenience, the structure of a GaN compound semiconductor laser to be manufactured according to the embodiments shown below will be first explained.

Figure 1:
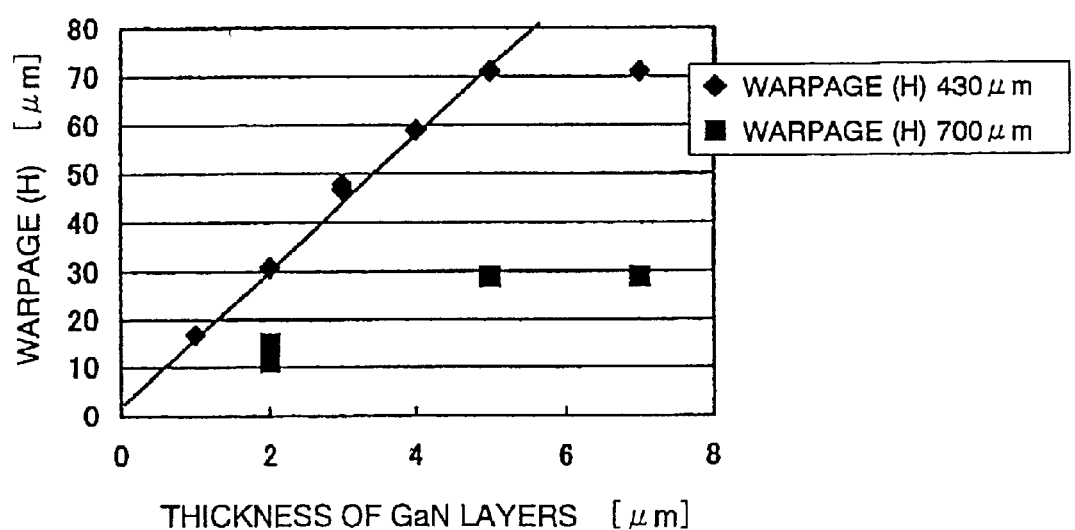
FIG. 1 is a schematic diagram that shows the relation between thickness of a GaN layer and warpage of a sapphire substrate.
Figure 2:
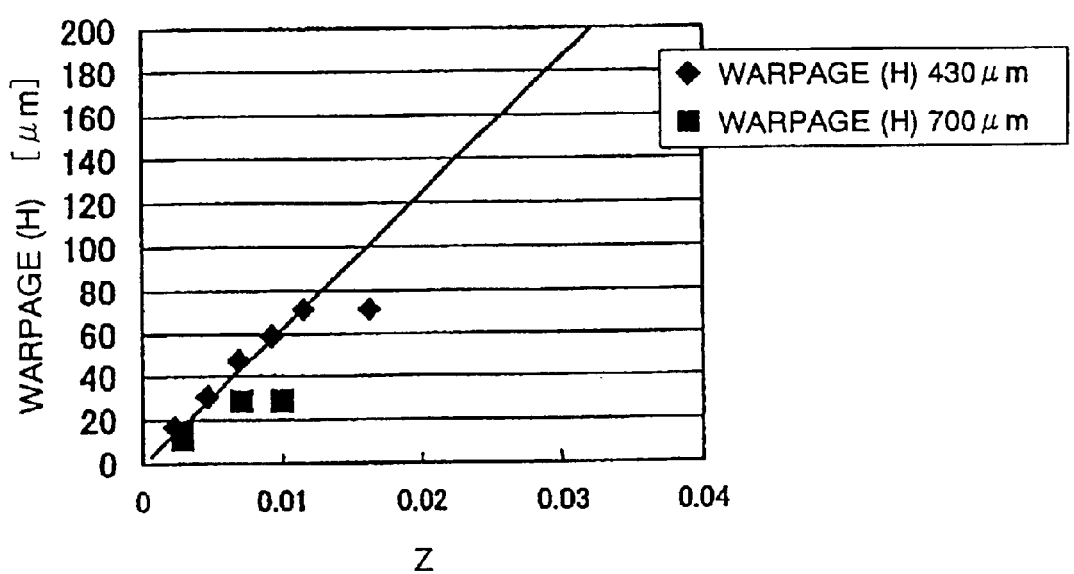
FIG. 2 is a schematic diagram that shows the relation between Z=(thickness of the GaN layer)/(thickness of the sapphire substrate) and warp age of the sapphire substrate.
Figure 4:
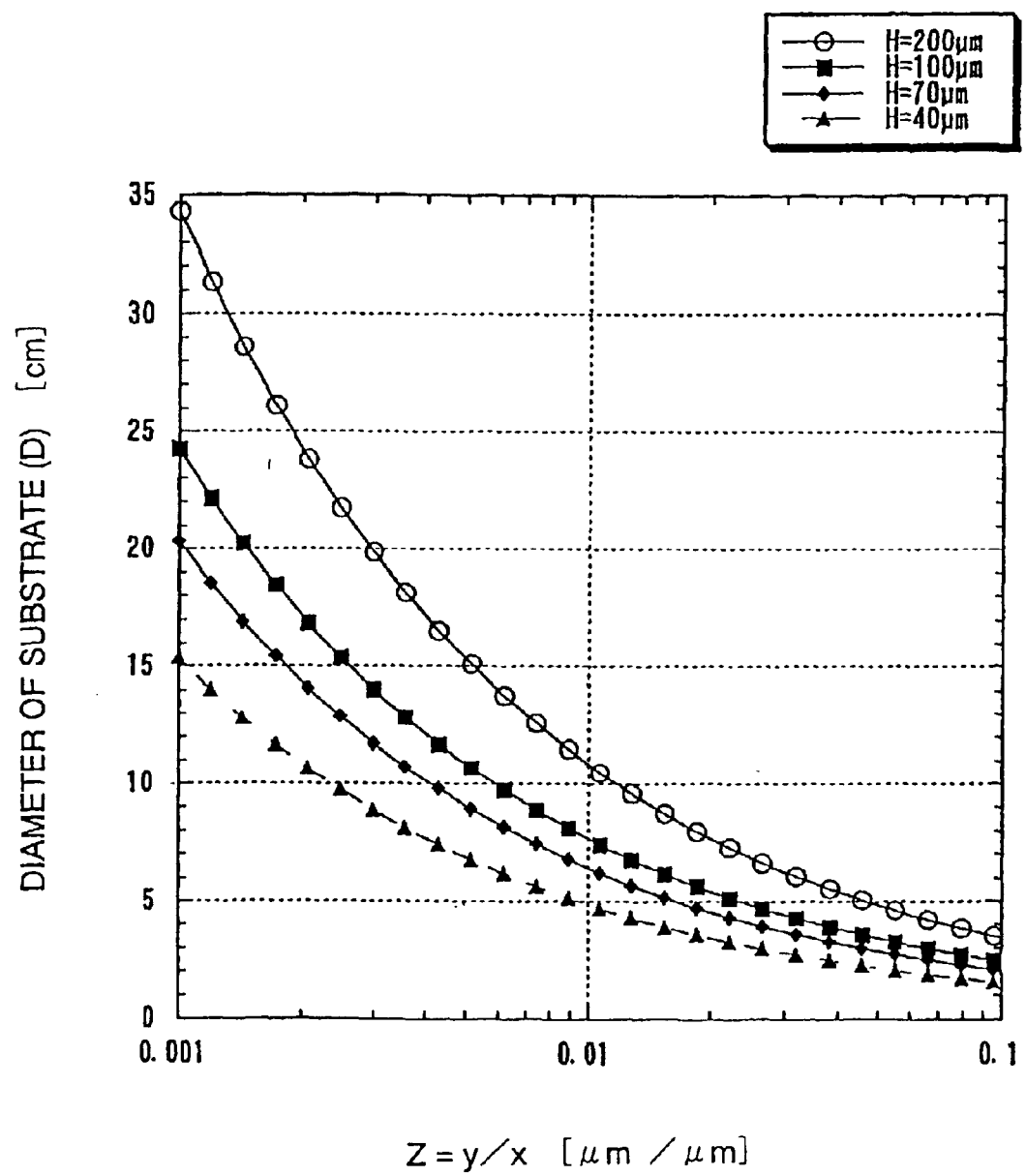
FIG. 4 is a schematic diagram that shows the relation between Z=(thickness of the GaN layer)/(thickness of the sapphire substrate) and diameter of the sapphire substrate for various values of warpage.
Figure 5:
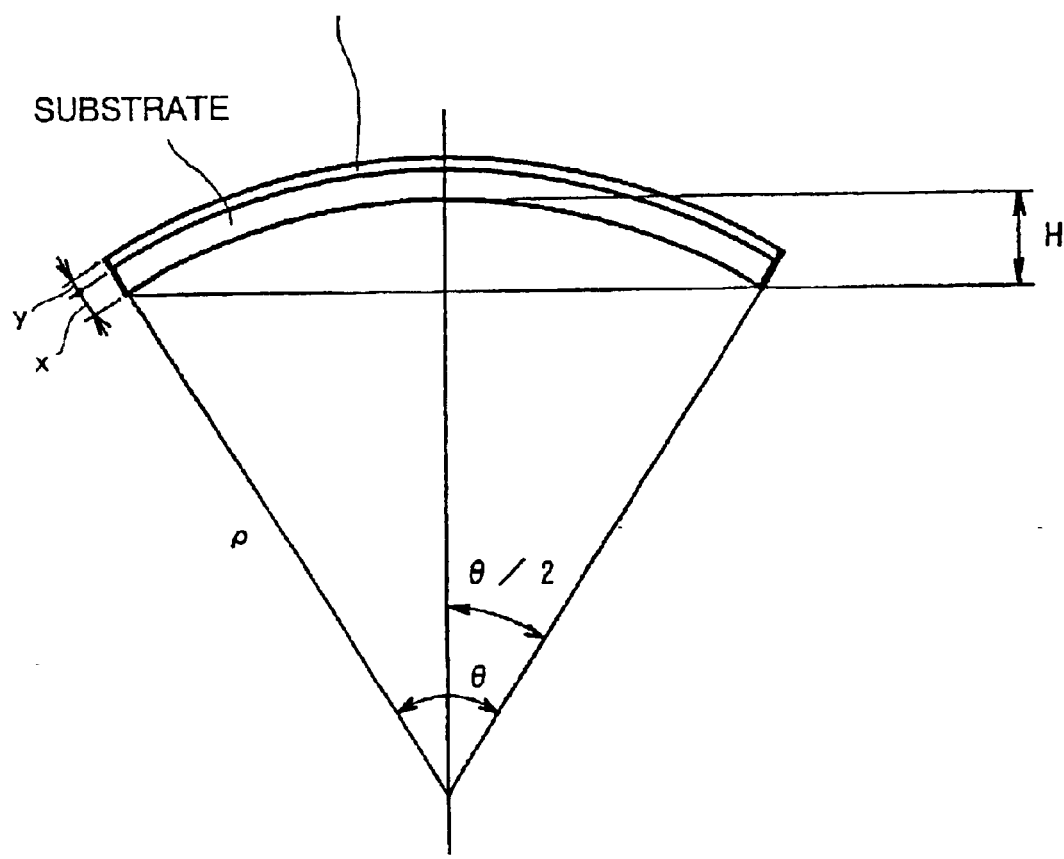
FIG. 5 is a schematic diagram for explaining the process of introducing Equation (1)
Figure 6:
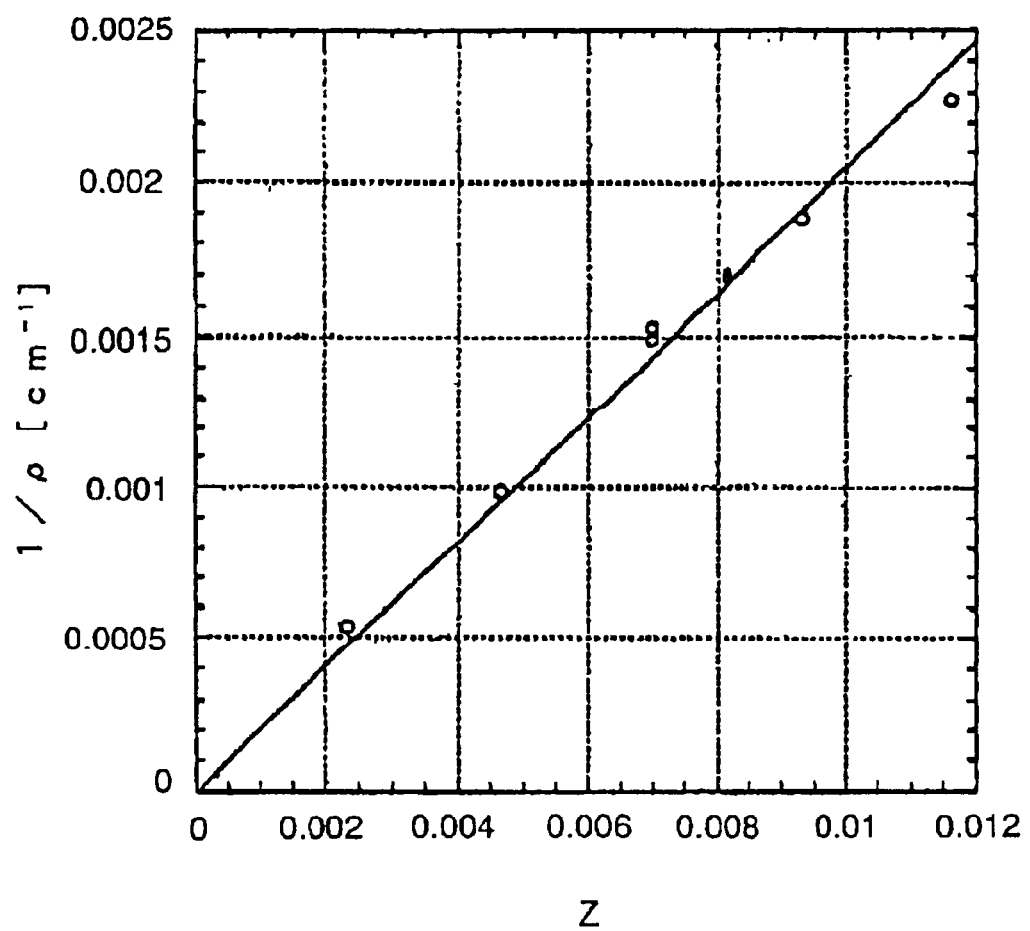
FIG. 6 is a schematic diagram that shows the relation between Z=(thickness of the GaN layer)/(thickness of the sapphire substrate) and curvature $1/\rho$ of the sapphire substrate.
Figure 7:
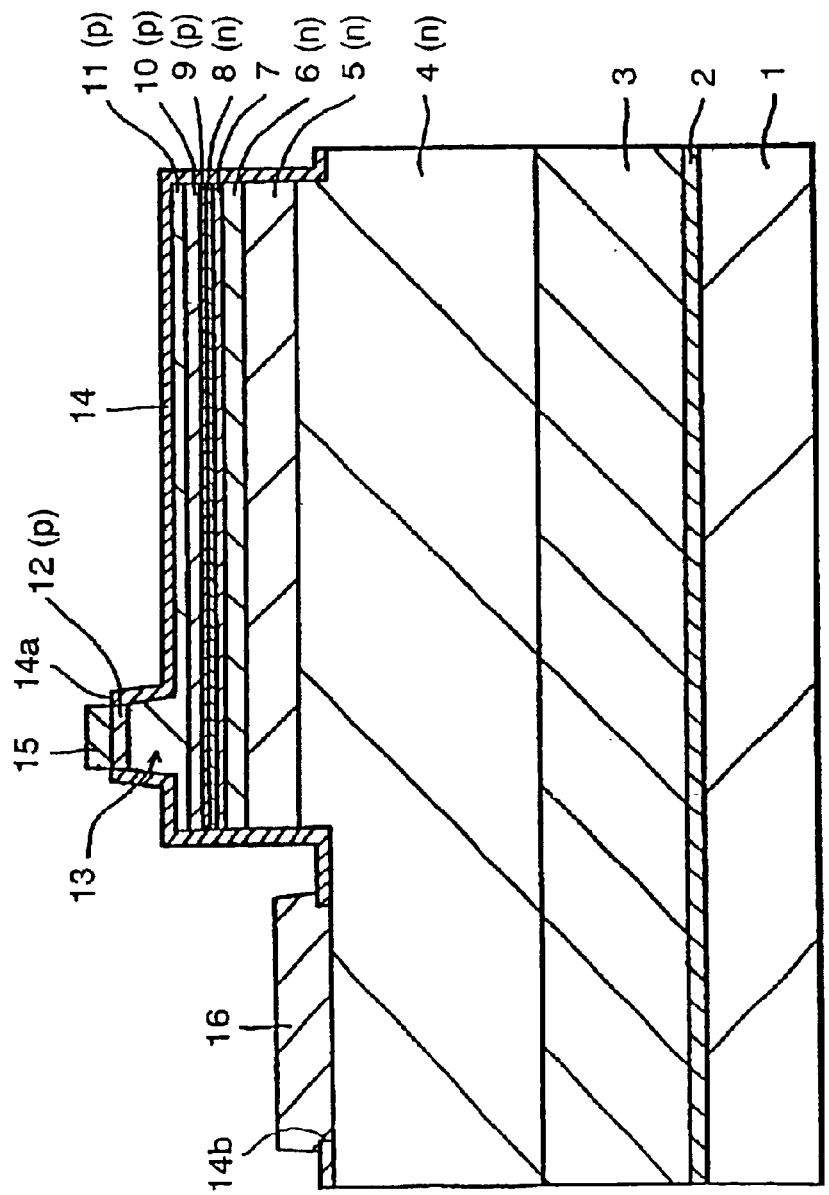
FIG. 7 is a cross-sectional view of a GaN compound semiconductor laser to be manufactured according to the first embodiment of the invention, taken along a plane perpendicular to the cavity lengthwise direction.

FIGS. 6 and 7 illustrate this GaN compound semiconductor laser. FIG. 6 is its cross-sectional view taken along the plane perpendicular to the cavity lengthwise direction. FIG. 7 is a cross-sectional view taken along the plane parallel to the cavity lengthwise direction. The GaN compound semiconductor laser has a ridge structure and a SCH structure (separate confinement heterostructure).

As shown in FIGS. 6 and 7, the GaN compound semiconductor laser, formed on a c-plane sapphire substrate 1 via a GaN buffer layer 2 by low temperature growth, includes an undoped GaN layer 3 grown by a lateral growth technique such as ELO, n-type GaN contact layer 4, n-type AlGaN cladding layer 5, n-type GaN waveguide layer 6, active layer 7 having, for example, an undoped $In_xGa_{1-x}N/In_yGa_{1-y}N$ multiquantum well structure, n-type undoped InGaN deterioration preventing layer 8, p-type AlGaN cap layer 9, p-type GaN waveguide layer 10, p-type AlGaN cladding layer 11 and p-type GaN contact layer 12 that are deposited sequentially.

The undoped GaN buffer layer 2 is 30 nm thick, for example. The undoped GaN layer 3 is 0.5 μm thick, for example. The n-type GaN contact layer 4 is 4 μm thick, for example, and doped with silicon (Si), for example, as the n-type impurity. The n-type AlGaN cladding layer 5 is 1.0 μm thick, for example, and doped with Si, for example, as the n-type impurity. Its Al composition is 0.07, for example. The n-type GaN waveguide layer 6 is 0.1 μm thick, for example, and doped with Si, for example, as the n-type impurity. In the active layer 7 having the undoped $In_xGa_{1-x}N/In_yGa_{1-y}N$ multiquantum well structure, the $In_xGa_{1-x}N$ layer as its well layer is 3.5 nm thick, for example, and x=0.08. The $In_yGa_{1-y}N$ layer as the barrier layer is 7 nm thick, for example, and y=0.02. The active layer 7 includes three well layers.

The undoped InGaN deterioration preventing layer 8 has a graded structure that monotonously deceases in indium (In) composition gradually from the surface adjacent to the active layer 7 toward the surface adjacent to the p-type AlGaN cap layer 9. Indium (In) composition of the layer 8 at the surface adjacent to the active layer 7 is equal to the indium (In) composition y of the $In_yGa_{1-y}N$ layer as the barrier layer of the active layer 7, and indium (In) composition of the layer 8 at the surface adjacent to the p-type AlGaN cap layer 9 is zero. The undoped InGaN deterioration preventing layer 8 may be, for example, 20 nm thick.

The p-type AlGaN cap layer 9 is 10 nm thick, for example, and doped with magnesium (Mg), for example, as the p-type impurity. Al composition of the p-type AlGaN cap layer 9 is 0.2, for example. The p-type AlGaN cap layer 9 is used for the purpose of preventing deterioration of the active layer 7 caused by decomposition of In therefrom during growth of the p-type GaN waveguide layer 10, p-type AlGaN cladding layer 11 and p-type GaN contact layer, and for the purpose of preventing overflow of carriers (electrons) from the active layer 7. The p-type GaN waveguide layer 10 is 0.1 μm thick, for example, and doped with Mg, for example as the p-type impurity. The p-type AlGaN cladding layer 11 is 0.5 μm thick, for example, and doped with Mg, for example, as its p-type impurity. Al composition of this layer 11 is 0.07, for example. The p-type GaN contact layer 12 is 0.1 μm thick, for example, and doped with Mg, for example, as the p-type impurity.

The upper part of the n-type GaN contact layer 4, n-type AlGaN cladding layer 5, n-type GaN waveguide layer 6, active layer 7, undoped InGaN deterioration preventing layer 8, p-type AlGaN cap layer 9, p-type GaN waveguide layer 10 and p-type AlGaN cladding layer 11 are shaped into a mesa configuration of a predetermined width. In this mesa portion, a ridge 13 is made up of the upper part of the p-type AlGaN cladding layer 11 and the p-type GaN contact layer 12 to extend in the <1–100> direction, for example. Width of the ridge 13 maybe 1.6 μm, for example.

An insulating film 14 such as a $SiO_2$ film having the thickness of 0.3 μm, for example, is formed to cover the entirety of the mesa portion. The insulating film 14 is used for the purpose of electric insulation and surface protection. The insulating film 14 has formed an opening 14a in the region above the ridge 13, and a p-side electrode 15 is in contact with the p-type GaN contact layer 12 through the opening 14a. The p-side electrode 15 has a structure made by sequentially depositing a Pd film, Pt film and Au film that are 10 nm thick, 100 nm thick and 300 nm thick, respectively. On the other hand, the insulating film 14 also has formed an opening 14b in a predetermined region adjacent to the mesa portion, and an n-side electrode 16 is in contact with the n-type GaN contact layer 4 through the opening 14b. The n-side electrode 16 has a structure made by sequentially depositing a Ti film, Pt film and Au film that are 10 nm thick, 50 nm thick and 100 nm thick, respectively.

Figure 8:
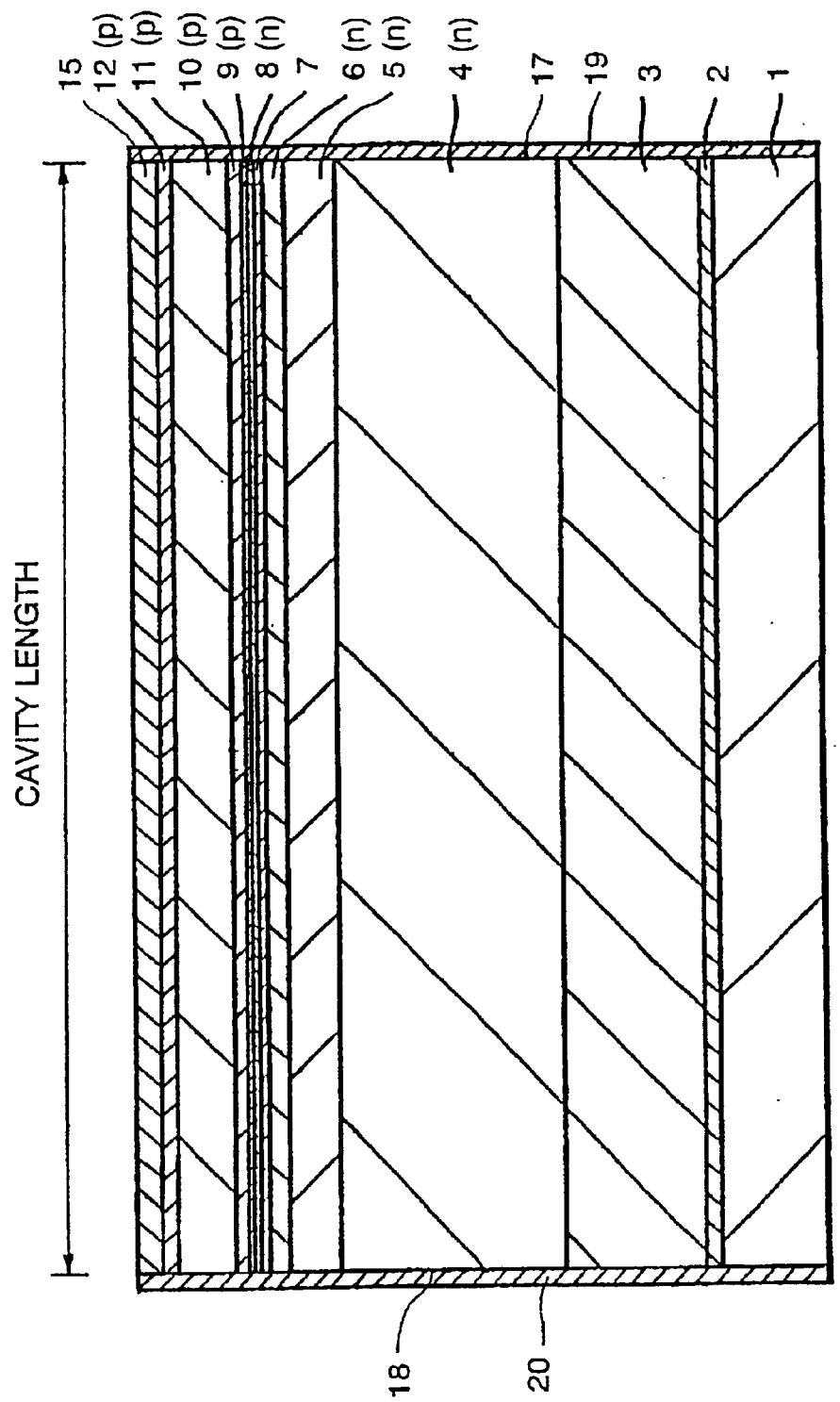
FIG. 8 is a cross-sectional view of the GaN compound semiconductor laser to be manufactured according to the first embodiment of the invention, taken along a plane parallel to the cavity lengthwise direction.

As shown in FIG. 8, edge coat films 19, 20 are formed on a front-side cavity edge surface 17 and a rear-side cavity edge surface 18, respectively. The front-side edge coat film 19 may be a single-layered $Al_2O_3$ film adjusted in thickness around $3\lambda/4n$ (where $\lambda$ is the laser oscillation wavelength and n is the refractive index) such that the refractive index of the front-side edge surface becomes 10%, for example. The read-side edge coat film 20 may be an $Al_2O_3/TiO_2$ multi-layered film adjusted in thickness to a value corresponding to four periods of $\lambda/4n$, for example, such that the refractive index of the rear-side edge surface becomes 95%, for example.

Next explained is a manufacturing method of the GaN compound semiconductor laser according to the first embodiment of the invention.

This embodiment uses a c-plane sapphire substrate 1 having a thickness x in the range from 600 to 1000 μm, e.g. 640 μm, and the diameter of 50 mm, and satisfies $0<y/x\leq 0.011$ with respect to the thickness y of the GaN compound semiconductor layers grown thereon.

More specifically, preparing the c-plane sapphire substrate 1 whose surface is cleaned by thermal cleaning beforehand, the undoped GaN buffer layer 2 is grown on the c-plane sapphire substrate 1 by MOCVD under a temperature around 500° C., for example. After that, the undoped GaN layer 3 is grown under the growth temperature 1000° C., for example, by a lateral growth technique such as ELO.

Subsequently, using MOCVD, the n-type GaN contact layer 4, n-type AlGaN cladding layer 5, n-type GaN waveguide layer 6, active layer 7 having the undoped Ga1-xInxN/Ga1-yInyN multiquantum well structure, undoped InGaN deterioration preventing layer 8, p-type AlGaN cap layer 9, p-type GaN waveguide layer 10, p-type AlGaN cladding layer 11 and p-type GaN contact layer 12 are sequentially grown on the undoped GaN layer 3. For growth of the layers not containing indium (In), namely, the n-type GaN contact layer 4, n-type AlGaN cladding layer 5, n-type GaN waveguide layer 6, p-type AlGaN cap layer 9, p-type GaN waveguide layer 10, p-type AlGaN cladding layer 11 and p-type GaN contact layer 12, the growth temperature is adjusted to 1000° C., for example. For growth of the active layer 7 having the Ga1-xInxN/Ga1-yInyN multiquantum well structure, which does not contain indium (In), the growth temperature is adjusted in the range from 700 to 800° C. for example, e.g. at 730° C. For growth of the undoped InGaN deterioration-preventing layer 8, its growth temperature is adjusted at the same value as the growth temperature of the active layer 7, namely, 730° C., for example, at the start of the growth, and thereafter, it is gradually raised linearly, for example, such that it rises up to the same growth temperature as that of the p-type AlGaN cap layer 9, namely, 835° C. for example, at the end of the growth.

As to source materials of these GaN compound semiconductor layers, trimethyl gallium (($CH_3)_3Ga$, TMG) is used as the source material of Ga, trimethyl aluminum (($CH_3)_3Al$, TMA) is used as the source material of Al, trimethyl indium (($CH_3)_3In$, TMI) is used as the source material of In, and $NH_3$ is used as the source material of N, for example. Carrier gas may be $H_2$, for example. As to dopants, silane ($SiH_4$) is used as the n-type dopant, and bis-methylcyclopentadienile magnesium (($CH_3C_5H_4)_2Mg$) or bis-cyclopentadienile magnesium (($C_5H_5)_2Mg$) is used as the p-type dopant.

Total thickness of the GaN compound semiconductor layers grown on the c-plane sapphire substrate 1 under the conditions mentioned above amounts to 6.4 μm approximately. In this case, y/x becomes y/x=6.4 μm/640 μm=0.01, and the warpage of the c-plane sapphire substrate 1 can be limited not to exceed 70 y/x.

In the next process, the c-plane sapphire substrate 1 having the GaN compound semiconductor layers grown thereon is taken out of the MOCVD apparatus. Then a $SiO_2$ film (not shown), 0.1 μm thick, for example is formed on the entire surface of the p-type GaN contact layer 12 by CVD, vacuum evaporation, sputtering, or the like, for example. After that, on this $SiO_2$ film, a resist pattern (not shown) corresponding to the shape of the mesa portion is formed by photolithography. In this photolithographic process, after a photo resist is coated on the entire substrate surface, it is exposed to light by using a predetermined photo mask in an exposure apparatus. Upon this exposure, since the warpage of the c-plane sapphire substrate 1 is limited not to exceed 70 μm, the mask can fit well over the entire surface of the substrate. After that, using this resist pattern as a mask, the $SiO_2$ film is etched and patterned by wet etching using an etching liquid of the fluoric acid series, or by RIE using an etching gas containing fluorine, such as $CF_4$ or $CHF_3$. Subsequently, using the patterned $SiO_2$ film as a mask, the structure is etched by RIE, for example, down to the n-type GaN contact layer 4. In this RIE process, a chlorine-series gas may be used as the etching gas, for example. As a result of this etching, upper part of the -type GaN contact layer 4, the n-type AlGaN cladding layer 5, n-type GaN waveguide layer 6, active layer 7, undoped InGaN deterioration-preventing layer 8, p-type AlGaN cap layer 9, p-type GaN waveguide layer 10, p-type AlGaN cladding layer 11 and p-type GaN contact layer 12 are patterned into a mesa configuration.

After that, the $SiO_2$ film used as the etching mask is removed, and another $SiO_2$ film (not shown), 0.2 μm thick for example, is again formed on the entire substrate surface by CVD, vacuum evaporation or sputtering, for example. Thereafter, a resist pattern (not shown) corresponding to the shape of the ridge portion is formed on the $SiO_2$ film by photolithography. Also in this photolithographic process, since the warpage of the c-plane sapphire substrate is limited not to exceed 70 μm during exposure of the photo resist, the mask can fit well over the entire substrate surface. After that, using this resist pattern as a mask, the $SiO_2$ film is selectively etched into a pattern corresponding to the ridge portion by wet etching using an etching liquid of the fluoric acid series, or by RIE using an etching gas containing fluorine, such as $CF_4$ or $CHF_3$.

In the next process, using the $SiO_2$ film as a mask, the p-type AlGaN cladding layer 11 is selectively removed by etching to a predetermined depth to make out the ridge 13. In this RIE process, a chlorine-series gas may be used as the etching gas, for example.

After that, the $SiO_2$ film used as the etching mask is removed, and the insulating layer 14 such as a $SiO_2$ film, 0.3

μm thick for example, is formed on the entire substrate surface by CVD, vacuum evaporation or sputtering, for example.

Subsequently, a resist pattern (not shown) is formed to cover a region of the insulating film 14 excluding the region for the n-side electrode by photolithography. Also in this photolithographic process, since the warpage of the c-plane sapphire substrate is limited to not exceed 70 μm during exposure of the photo resist, the mask can fit well over the entire substrate surface.

Next using this resist pattern as a mask, the insulating film 14 is selectively etched to form the opening 14b.

In the next process, maintaining the resist pattern there, a Ti film, Pt film and Au film are sequentially deposited on the entire substrate surface by vacuum evaporation, for example. Thereafter, the resist pattern is removed together with the overlying part of the Ti film, Pt film and Au film (lift-off). As a result, the n-side electrode 16 is formed in contact with the n-type GaN contact layer 4 through the opening in the insulating film 14. The Ti film, Pt film and Au film forming the n-side electrode 16 are, respectively, 10 nm thick, 50 nm thick and 100 nm thick. An alloying process is next carried out for making ohmic contact of the n-side electrode 16.

Subsequently, after the opening 14a is formed by selectively removing the insulating film 14 by etching from above the ridge 13 in a similar process, and p-side electrode 15 having the Pd/Pt/Au structure in contact with the p-type GaN contact layer 12 through the opening 14a is formed in the same manner as the n-side electrode 16. Thereafter, an alloying process is carried out for making ohmic contact of the p-side electrode 15.

Subsequently, the c-plane sapphire substrate 1 is polished from its bottom surface to thin it to 100 through 200 μm, for example. Just before this polishing process, the warpage of the c-plane sapphire substrate 1 is limited not to exceed 70 μm. Therefore, the polishing is performed without inviting problems such as cracking of the c-plane sapphire substrate.

Figure 9:
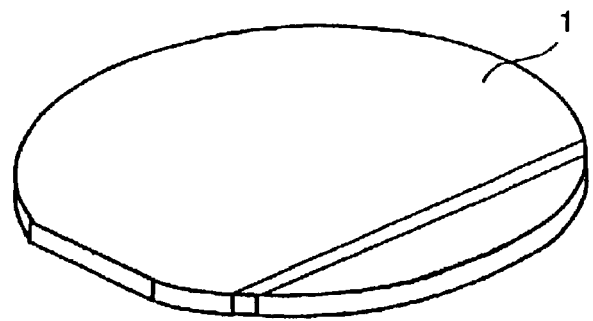
FIG. 9 is a perspective view for explaining a manufacturing method of the GaN compound semiconductor laser according to the first embodiment of the invention.
Figure 10:
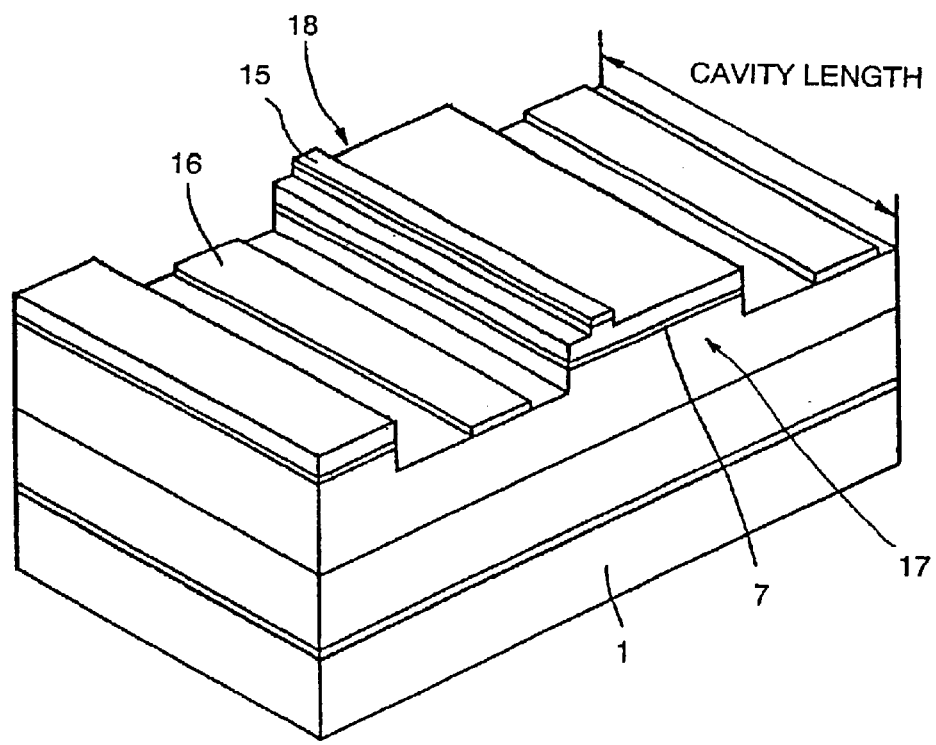
FIG. 10 is a perspective view for explaining a manufacturing method of the GaN compound semiconductor laser according to the first embodiment of the invention.
Figure 11:
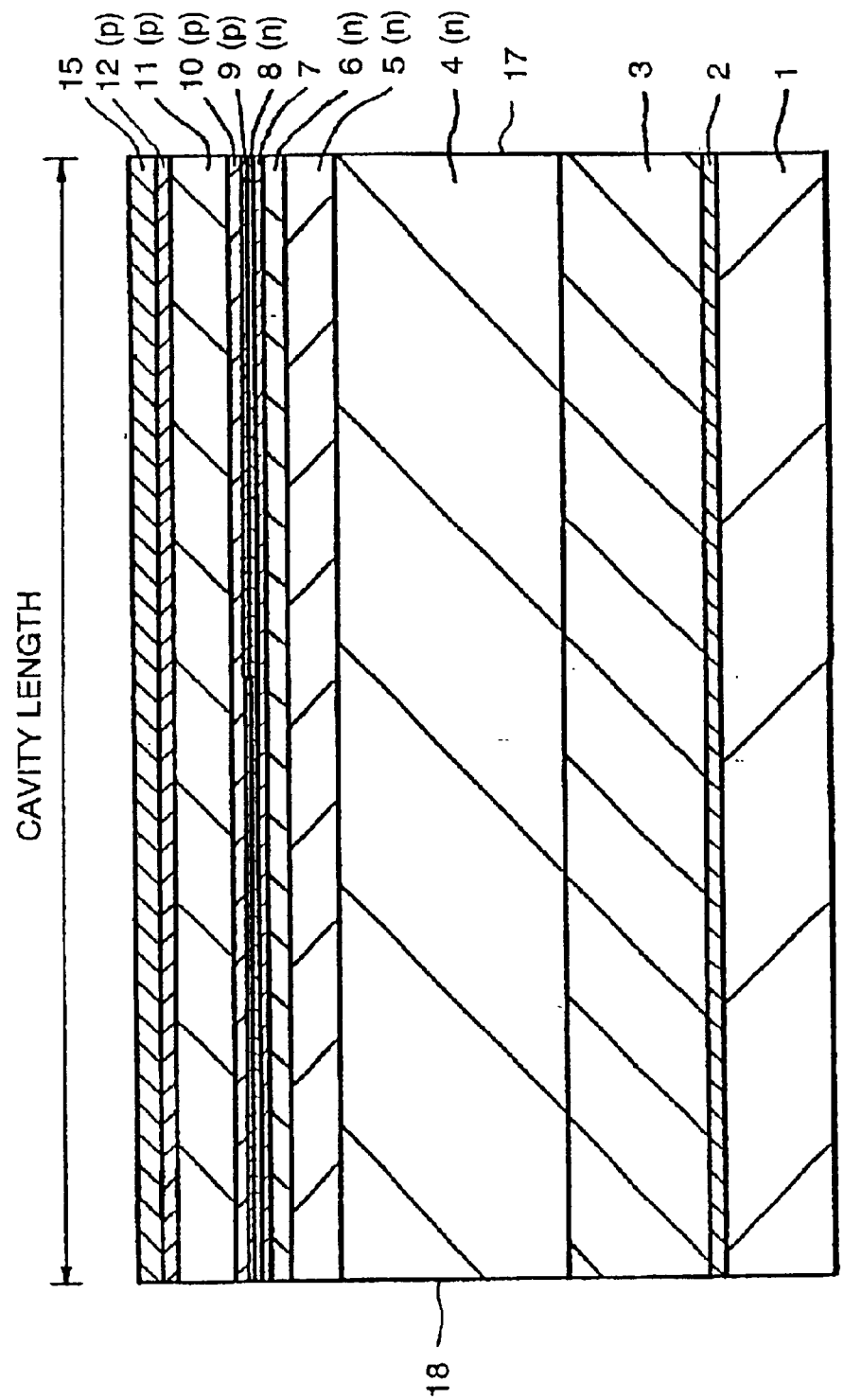
FIG. 11 is a perspective view for explaining a manufacturing method of the GaN compound semiconductor laser according to the first embodiment of the invention.

After that, the substrate having the laser structure and the electrode formed thereon is cleaved into bars as shown in FIG. 9, thereby to make out cavity edges 17, 18 as shown in FIGS. 10 and 11. Thereafter, edge coat materials are coated on the cavity edges 17, 18 to protect them. More specifically, as shown in FIG. 18, the edge coat film 19 of the above-mentioned material and thickness is formed on the front-side cavity edge 17, and the edge coat film 20 of the above-mentioned material and thickness is formed on the read-side cavity edge 18. For forming these edge coat films 19, 20, sputtering may be used for example.

Bars having formed the edge coat films 10, 20 are taken out of the apparatus, and each bar is pelletized to form laser chips as shown in FIGS. 7 and 8.

Thereafter, each laser chip is packaged to obtain the intended GaN compound semiconductor laser having the ridge structure and SCH structure.

As explained above, the first embodiment manufactures the GaN compound semiconductor laser by using the c-plane sapphire substrate 1 sized 50 mm in diameter and 640 μm in thickness x, which is thicker than conventional ones, and by growing GaN compound semiconductor layers on the c-plane sapphire substrate 1 such that their total thickness y amounts to 6.4 μm, and therefore, it can adjust the ratio y/x to be y/x=6.4/640=0.01 and can limit the warpage of the c-plane sapphire substrate 1 not to exceed 70 μm not only during growth of the GaN compound semiconductor layers but also at the completion of the growth. Thus the embodiment can maintain the warpage of the c-plane sapphire substrate 1 not to exceed 70 μm in the photolithographic process, especially upon exposure, and just before polishing the bottom of the c-plane sapphire substrate 1. As a result, the embodiment can keep the distance between the photo mask and the resist uniform over the substrate area and can prevent dimensional deviation between the photo mask and the substrate over the substrate area such that the mask accurately fits over the entire substrate area. It is therefore possible to make the ridge in the less-defective region between the seed crystal and the meeint portion of the lateral growth, i.e. in the wing portion. Without deviation of the ridge from the wing portion, the embodiment can improve the laser properties, e.g. the lifetime, inter alia, and can improve the production yield. Additionally, the embodiment can prevent the c-plane sapphire substrate 1 from cracking when it is polished from the bottom.

Moreover, since the embodiment can limit the warpage of the c-plane sapphire substrate 1 to as small as 70 μm or less during growth of the GaN compound semiconductor layers as explained above, it ensures uniform temperature distribution along the plane upon crystal growth of the GaN compound semiconductor layers, thereby ensures the GaN compound semiconductor layers to be uniform in composition and thickness and particularly the active layer to be uniform in composition so as to improve evenness of the emission wavelength.

With these advantages, the embodiment can manufacture a long-lived, high-performance GaN compound semiconductor laser by high productivity and production yield.

Next explained is a manufacturing method of a GaN compound semiconductor laser according to the second embodiment of the invention.

The second embodiment uses a c-plane sapphire substrate 1 having the thickness of 430 μm and having a diameter D satisfying the equation $$0<D<(2/CZ)\cos^{-1}(1-HCZ)$$

and grows GaN compound semiconductor layers, 6.4 μm thick in total, on the c-plane sapphire substrate 1 similarly to the first embodiment. If that equation is substituted by C=0.20567 cm$^{-1}$, H=70 μm=70×10$^{-4}$ cm, Z=6.4/430= 0.0149, it results in $$0<D<4.27 \text{ cm}$$

Assume here that D satisfying the inequality is 4 cm. That is, in the second embodiment, a c-plane sapphire substrate 1 having the diameter of 4 cm and the thickness of 430 μm is used to manufacture the GaN compound semiconductor laser.

The other features of the second embodiment are common to those of the first embodiment, and are omitted from explanation.

The second embodiment also ensures the same advantages as those of the first embodiment.

Heretofore, embodiments of the invention have been explained specifically. However, the invention is not limited to those embodiments but contemplates various changes and modifications based on the technical concept of the invention.

For example, numerical values, structures, substrates, source materials, processes, and the like, specifically indicated in conjunction with the first and second embodiments are not but examples, and any appropriate numerical values, structures, substrates, source materials, processes, etc. may be used.

For example, the first and second embodiments have been explained as first depositing n-type layers of the laser structure on the substrate and thereafter depositing p-type layers. However, the order of deposition may be opposite to first deposit p-type layers on the substrate and thereafter deposit n-type layers.

Further, the first and second embodiments use the c-plane sapphire substrate, but a SiC substrate, Si substrate or spinel substrate, for example, may be used instead, where appropriate. Furthermore, an AlN buffer layer or AlGaN buffer layer may be used instead of the GaN buffer layer.

The first and second embodiments have been explained as applying the invention to the manufacture of a GaN compound semiconductor laser of a SCH structure. Instead, the invention is applicable to the manufacture of a GaN compound semiconductor laser of a DH structure (double heterostructure), for example, or to the manufacture of a GaN compound light emitting diode, or further to an electron transporting device using nitride III-V compound semiconductors, such as GaN compound FET, GaN compound heterojunction bipolar transistor (HBT), for example.

The first and second embodiments have been explained as using H2 gas as the carrier gas for growth by MOCVD. However, any other appropriate gas may be used such as H2 with N2, or a mixture with He or Ar gas.

As described above, according to the invention, when the thickness of the substrate is x ($\mu$m), and the thickness of the nitride III-V compound semiconductor layers is y ($\mu$m), by adjusting them to satisfy $0<y/x\leq 0.011$ and $x\geq 450$ $\mu$m, warpage of the substrate can be limited not to exceed 70 $\mu$m. Therefore, the invention can remove various problems caused by warpage of the substrate, such as adverse influences to exposure in the photolithographic process or problems in the bottom polishing process, and thereby ensure high productivity and good yield of long-lived, high-performance semiconductor light emitting devices or semiconductor devices.

Further, when the maximum dimension of the substrate is D (cm), warpage of the substrate is in the range of $0<H\leq 70\times 10^{-4}$ (cm), and Z=(thickness of nitride III-V compound semiconductor layers)/(thickness of the substrate), by adjusting them to satisfy $$0<D<(2/CZ)\cos^{-1}(1-HCZ)$$

where C (cm$^{-1}$) is the proportionality constant when the radius of curvature of the substrate $\rho$ (cm) is expressed as $1/\rho=CZ$, the invention can limit the warpage of the substrate not to exceed 70 $\mu$m. Therefore, the invention can remove various problems caused by warpage of the substrate, such as adverse influences to exposure in the photolithographic process or problems in the bottom polishing process, and thereby ensure high productivity and good yield of long-lived, high-performance semiconductor light emitting devices or semiconductor devices.

What is claimed is:

1. A nitride III-V compound semiconductor substrate in which nitride III-V compound semiconductor layers are formed on a substrate of a material different from those of said nitride III-V compound semiconductor layers, comprising:

$$0<y/x\leq 0.011 \text{ and } x\geq 450 \text{ }\mu m$$

being satisfied when thickness of said substrate of said material is x ($\mu$m) and thickness of said nitride III-V compound semiconductor layers is y ($\mu$m).

2. The nitride III-V compound semiconductor substrate according to claim 1 wherein said x is in the range of 450 $\mu$m$\leq$x<1000 $\mu$m.

3. The nitride III-V compound semiconductor substrate according to claim 1 wherein said y/x is in the range of $0<y/x\leq 0.0066$.

4. The nitride III-V compound semiconductor substrate according to claim 3 wherein said x is in the range of 450 $\mu$m$\leq$x<1000 $\mu$m.

5. The nitride III-V compound semiconductor substrate according to claim 1 wherein said substrate of said material is a sapphire substrate.

6. A nitride III-V compound semiconductor substrate in which nitride III-V compound semiconductor layers are formed on a substrate of a material different from those of said nitride III-V compound semiconductor layers, comprising:

$$0<D<(2/CZ)\cos^{-1}(1-HCZ)$$

being satisfied when the maximum dimension along the plane of said substrate of said material is D (cm), warpage of said substrate of said material is in the range of $0<H\leq 70\times 10^{-4}$ (cm), Z=(thickness of nitride III-V compound semiconductor layers)/(thickness of the substrate of said material), and C (cm$^{-1}$) is the proportionality constant when the radius of curvature $\rho$ (cm) of said substrate of said material is expressed as $1/\rho=CZ$.

7. The nitride III-V compound semiconductor substrate according to claim 6 wherein said warpage of said substrate of said material is in the range of $0<H\leq 40\times 10^{-4}$ (cm).

8. The nitride III-V compound semiconductor substrate according to claim 6 wherein said substrate of said material is a sapphire substrate.

9. The nitride III-V compound semiconductor substrate according to claim 6 wherein C=0.20567.

* * * * *